United States Patent
Simizu

[19]

[11] Patent Number: 6,087,668
[45] Date of Patent: Jul. 11, 2000

[54] CHARGED-PARTICLE-BEAM PROJECTION METHOD AND APPARATUS

[75] Inventor: Hiroyasu Simizu, Kawasaki, Japan

[73] Assignee: Nikon Corporation, Tokyo, Japan

[21] Appl. No.: 08/966,262

[22] Filed: Nov. 7, 1997

[30] Foreign Application Priority Data

Nov. 7, 1996 [JP] Japan .................................... 8-295157

[51] Int. Cl.$^7$ .......................... H01J 37/302; H01J 37/304
[52] U.S. Cl. ...................................... 250/492.22; 250/398
[58] Field of Search ........................... 250/492.2, 492.22, 250/398

[56] References Cited

U.S. PATENT DOCUMENTS

| | | | |
|---|---|---|---|
| 4,985,634 | 1/1991 | Stengl et al. ............................. | 250/398 |
| 5,051,556 | 9/1991 | Sakamoto et al. ................. | 250/492.22 |
| 5,466,904 | 11/1995 | Pfeiffer et al. ........................ | 250/492.3 |
| 5,483,056 | 1/1996 | Imai ..................................... | 250/201.4 |
| 5,545,902 | 8/1996 | Pfeiffer et al. .......................... | 250/398 |
| 5,834,783 | 11/1998 | Muraki et al. ........................... | 250/398 |
| 5,894,132 | 4/1999 | Nakasuji et al. .................... | 250/492.22 |

*Primary Examiner*—Bruce C. Anderson
*Attorney, Agent, or Firm*—Klarquist Sparkman Campbell Leigh & Whinston, LLP

[57] ABSTRACT

Apparatus and methods are disclosed for projecting a mask pattern, divided into multiple mask subfields, onto a substrate at high resolution using a charged-particle beam (CPB). At least some of the mask subfields comprise "minimum-linewidth regions". To expose each mask subfield, a CPB (e.g., electron beam) is directed onto the mask subfield. The image of the mask subfield is projected by lens systems onto a respective transfer subfield on the substrate. Deflectors deflect the CPB to the selected mask subfield and to the corresponding transfer subfield on the substrate. A memory stores data concerning the locations of minimum-linewidth regions in the selected mask subfields and the corresponding amount of deflection of the beam for each corresponding mask subfield. An arithmetical processor calculates required focal lengths of the projection lens systems, based on the locations of the minimum-linewidth regions and on the amount of beam deflection required for each respective mask subfield, required to minimize the degree of blur of the minimum linewidth features of the respective mask subfield in the respective transfer subfield. A controller controls the amount of power delivered to the projection lens systems so that their focal lengths agree with the calculation results. The calculations can be performed in advance of exposure by a separate calculator and the resulting data stored in a memory for later recall and use by the controller.

10 Claims, 3 Drawing Sheets

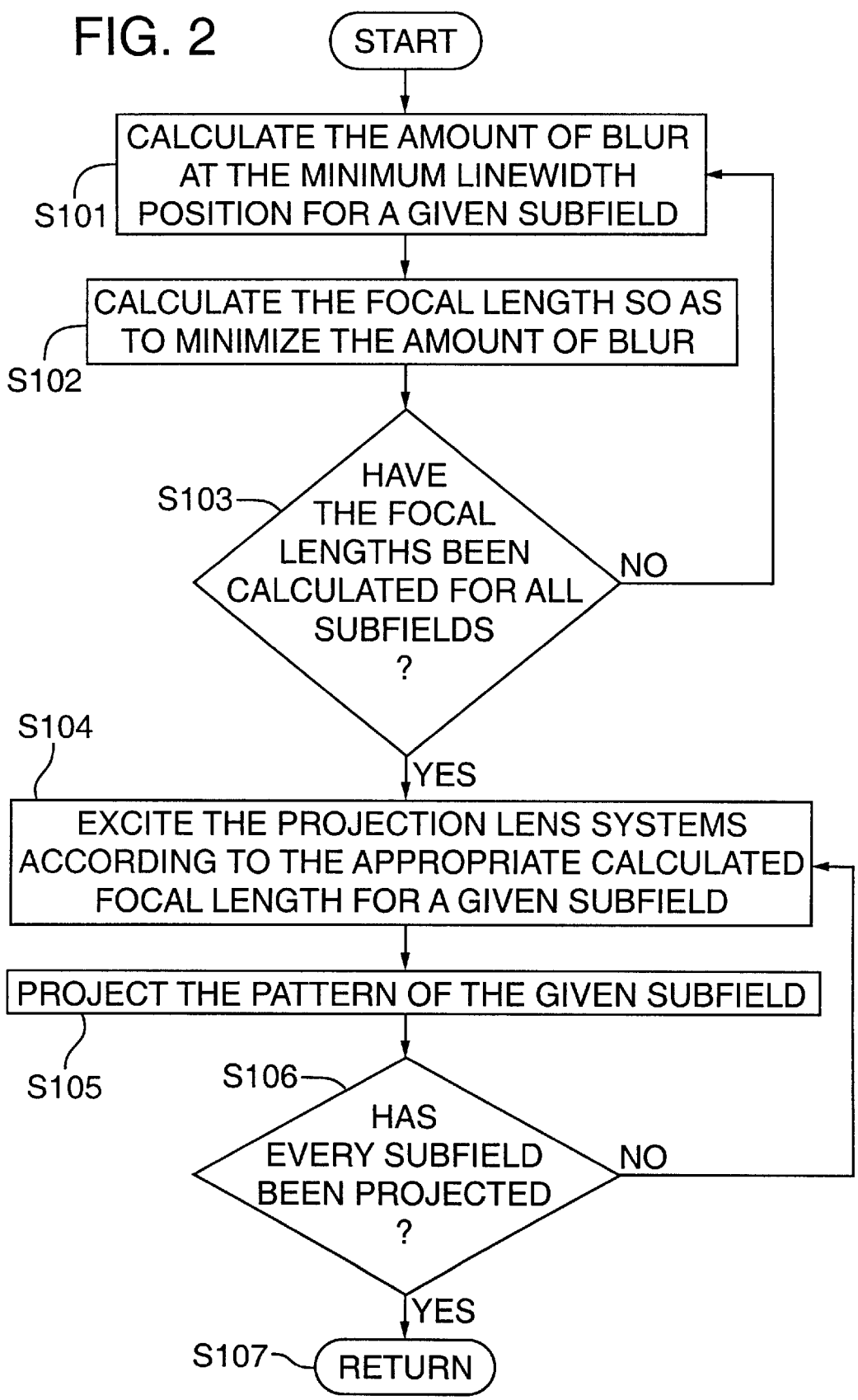

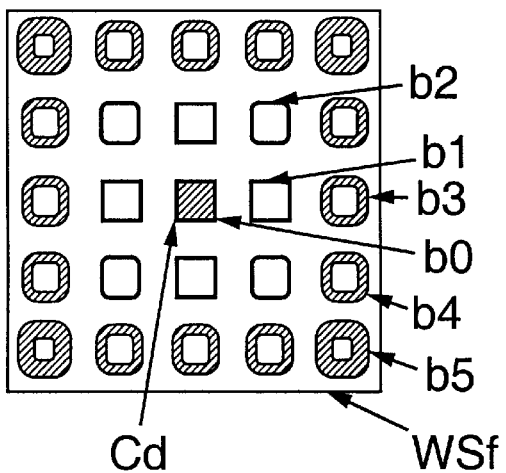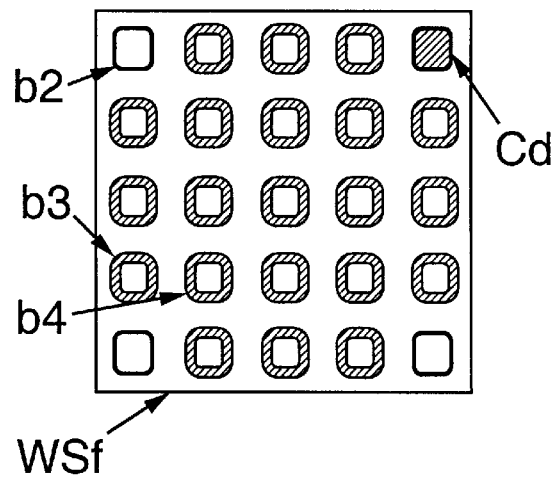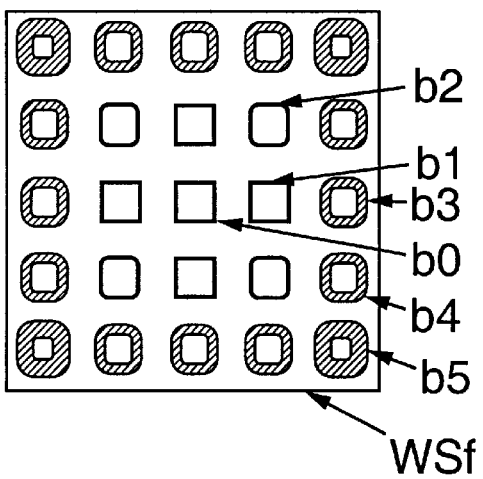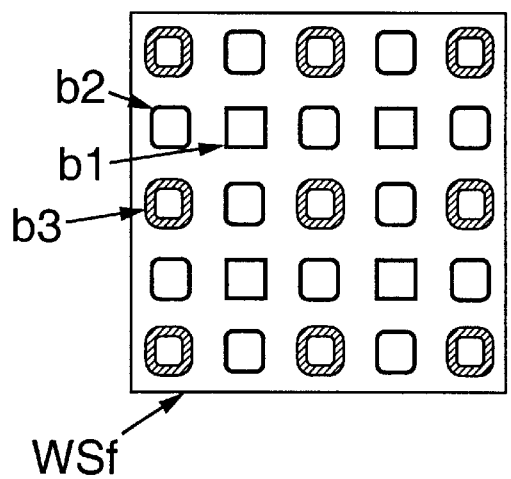

CHARGED-PARTICLE-BEAM PROJECTION METHOD AND APPARATUS

FIELD OF THE INVENTION

The present invention relates to charged-particle-beam (CPB) projection methods and to CPB projection apparatus used for transferring a mask pattern onto a sensitive substrate (e.g., semiconductor wafer) by projection exposure, and particularly to CPB projection methods and apparatus in which the projected image is adjusted to decrease blur.

BACKGROUND OF THE INVENTION

In charged-particle-beam (CPB) projection apparatus based on a partitioned pattern-transfer method, the pattern field of a reticle or a mask (collectively referred to as a "mask") is divided (partitioned) into multiple mask subfields. The pattern on the mask is "transferred" (i.e., projection-exposed) onto a sensitive substrate, such as a wafer, sequentially one mask subfield at a time. The respective projected images of the mask subfields ("transfer subfields") on the substrate are "stitched" together to eliminate the partitions and produce an entire pattern, faithful to the mask pattern, on the substrate.

During conventional transfer processes, the image in each transfer subfield on the substrate is often blurred due, e.g., to lens aberrations, and/or to deflection aberrations caused when the charged-particle beam is deflected.

FIG. 4(a) illustrates a transfer subfield WSf formed by a conventional method on a substrate surface. Portions of the image of the corresponding mask subfield within the transfer subfield WSf are blurred. To illustrate the blurring, the transfer subfield WSf of FIG. 4(a) comprises twenty-five (25) rectangular pattern segments arranged in five vertical columns and five horizontal rows. The relative degree of blur at each of the pattern segments is represented by the symbols b0 through b5, with b0 representing the least amount of blur and b5 representing maximal blur. In FIG. 4(a), the contour of each pattern segment is depicted by six different types of lines representing relative degrees of blur. The wider the line outlining a particular pattern segment, the greater the blur.

Whenever the particle beam of the CPB projection apparatus is focused on the center of a transfer subfield WSf, the blur of the corresponding pattern segment at the center of the transfer subfield is usually minimal (b0), as shown in FIG. 4(a). Due to any of various aberrations such as distortion, coma, and astigmatism, the blur with which pattern segments are projected tends to increase with increasing distance of the subject particular pattern segment from the center of the transfer subfield WSf. Spherical aberration and chromatic aberration can also occur on the optical axis of the charged-particle beam, which can result in blurring of pattern segments in the center of the transfer subfield.

According to one conventional way in which to reduce blur, the focal point of each transfer subfield is axially displaced from the substrate surface so as to reduce axial spherical aberration and field curvature. Such a remedy tends to minimize blur of pattern segments that are located in regions of the transfer subfield between the center and the periphery of the transfer subfield WSf, as indicated in FIG. 4(b). As a result of such a focal-point adjustment process, the degree of blur in each projected transfer subfield has a more limited range, typically from b1 to b3. Thus, the extreme of blur represented by the symbol b5 of FIG. 4(a) is not found in the transfer subfield shown in FIG. 4(b).

The pattern segments contained in each individual mask subfield of an actual mask pattern usually differ from one another. As a result, the relative position, within each mask subfield, of minimum-linewidth features (which must be exposed with the highest accuracy) can vary from one mask subfield to another. If the focal-point adjustment scheme shown in FIG. 4(b) is uniformly applied to all the mask subfields, problems can arise in which certain minimum-linewidth features, when transferred to the respective transfer subfield on the substrate, have insufficient resolution.

For example, if minimum-linewidth features are situated in a peripheral portion of a mask subfield, the degree of blur of pattern segments can be at the b3 level in peripheral regions of the corresponding transfer subfield WSf, as shown in FIG. 4(b). As a result, the degree of blur is greater in those segments of the transfer subfield including minimum-linewidth features than in other segments of the transfer subfield.

SUMMARY OF THE INVENTION

In view of the shortcomings of the prior art summarized above, the present invention provides charged-particle-beam (CPB) projection methods and CPB projection-exposure apparatus that minimize the degree of blur in pattern segments of transfer subfields that include minimum-linewidth features.

According to one aspect of the present invention, CPB projection methods are provided in which a charged-particle beam is irradiated on a mask 100 defining a pattern divided into multiple mask subfields $Sf_1$ through $Sf_n$. Each mask subfield $Sf_1$–$Sf_n$ is projected onto a corresponding transfer subfield WSf on a sensitive substrate 110 using a CPB-optical system comprising multiple projection lens systems and multiple deflectors.

For each mask subfield Sf, the focal length of each of the projection lens systems is adjusted based on the location, in each of the mask subfields Sf, of pattern segments having minimum-linewidth features. Such adjustment minimizes the degree of blur in those regions of the corresponding transfer subfield WSf in which pattern segments containing minimum-linewidth features are present.

According to another aspect of the invention, CPB projection methods are provided in which a charged-particle beam is transmitted to a mask defining a pattern divided into multiple mask subfields $Sf_1$ through $Sf_n$. An image of each mask subfield $Sf_1$ through $Sf_n$ is transferred to a respective transfer subfield on a sensitive substrate using a CPB-optical system comprising multiple projection lens systems and multiple deflectors.

For each mask subfield Sf, the focal length of each projection lens system is adjusted based on the location, in each of the mask subfields Sf, of pattern segments having minimum-linewidth features and on the amount of deflection imparted to the charged-particle beam by the deflectors to reach the subject mask subfield and corresponding transfer subfield. This minimizes the degree of blur within each transfer subfield WSf of pattern segments having minimum-linewidth features.

According to yet another aspect of the invention, CPB projection apparatus are provided, comprising: (1) a beam emitter for emitting a charged-particle beam and irradiating the charged-particle beam onto a mask defining a pattern that is divided into multiple mask subfields; (2) multiple deflectors for deflecting the charged-particle beam sequentially to each of the mask subfields for passage through the mask subfield, and for appropriately deflecting the charged-particle beam, after the beam has passed through the mask subfield, onto a respective transfer subfield on a sensitive substrate; and (3) a CPB-optical system comprising multiple projection lens systems for projecting an image of each mask subfield onto the respective transfer subfield on the substrate. The CPB projection apparatus preferably further comprises: (1) a memory that stores data concerning the positions of pattern segments having minimum-linewidth features within each of the mask subfields Sf; (2) an arithmetical processor that calculates optimal focal lengths of the projection lens systems based on the positions, within each mask subfield Sf, of the pattern segments having minimum-linewidth features, so as to minimize the degree of blur, caused by the aberrations of the projection lens systems, in pattern segments having minimum-linewidth features; and (3) a controller that controllably sets the focal lengths of the projection lens systems according to the values determined by the arithmetical processor.

According to yet another aspect of the invention, CPB projection apparatus are provided that comprise an arithmetical processor that calculates, for each of the mask subfields, the focal lengths of projection lens systems based on the locations within each respective mask subfield of pattern segments having minimum-linewidth features, and on the degree of deflection of the charged-particle beam imparted by the deflectors in order to project each of the mask subfields, so that blur of each subfield image on the respective transfer subfield, caused by aberrations of the projection lens systems and by the deflection-dependent aberrations caused by the deflectors, is minimized in pattern segments having minimum-linewidth features. Data concerning the positions of minimum-linewidth features in each mask subfield are stored in a memory and recalled as required to make the respective calculations before exposure of the respective mask subfield.

The aspects of the invention summarized above are by way of example only and are not to be construed as limiting in any way. Also, further objects and advantages of the present invention will be apparent to those of ordinary skill in the art from the following description, which proceeds with reference to accompanying figures.

BRIEF DESCRIPTION OF THE DRAWINGS

FIG. 2 is a flowchart showing aspects of operation of a controller 14 in the FIG. 1 embodiment.

FIGS. 3(a) and 3(b) schematically depict blur distributions in exemplary transfer subfields projected onto the surface of a substrate, to illustrate the effect of a focal length adjustment made according to the invention. In FIG. 3(a), pattern segments having minimum-linewidth features are centrally located in the transfer subfield WSf. In FIG. 3(b), pattern segments having minimum-linewidth features are located in the upper right corner of the transfer subfield WSf.

FIGS. 4(a) and 4(b) illustrate blur distributions in a transfer subfield before (FIG. 4(a)) and after (FIG. 4(b)) focal length adjustment according to a conventional method.

DETAILED DESCRIPTION

Figure 1:
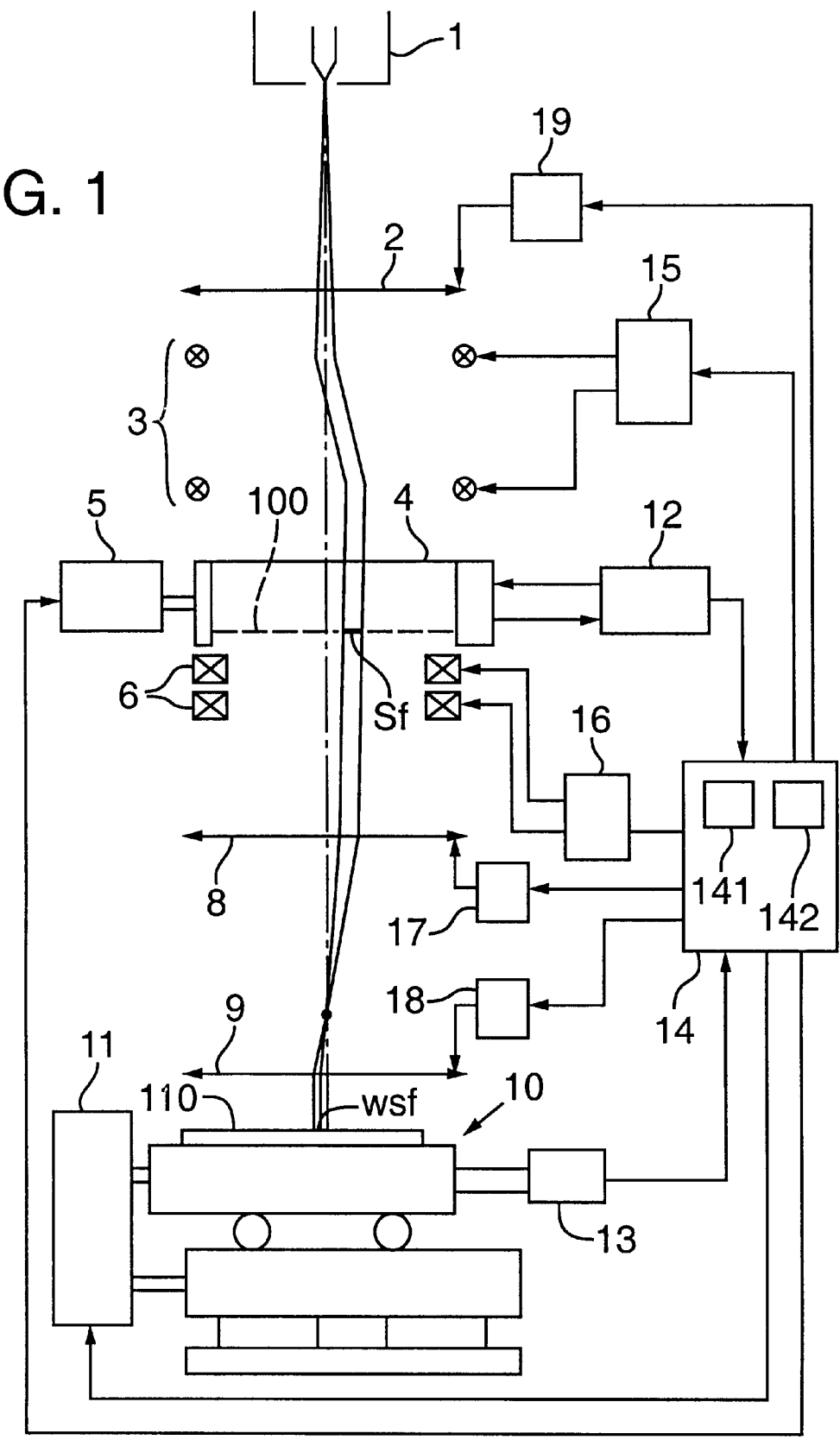
FIG. 1 is an elevational schematic view of a charged-particle-beam (CPB) projection apparatus according to a preferred embodiment of the invention.

A preferred embodiment of the present invention will be explained with reference to FIGS. 1–3.

FIG. 1 illustrates a charged-particle-beam (CPB) projection apparatus according to the preferred embodiment. The apparatus is particularly adapted for use with an electron beam as the charged-particle beam, but it will be understood that the features shown in FIG. 1 can be readily used with any of various other charged-particle beams, such as an ion beam. The mask 100 used in this apparatus is divided into a plurality of mask subfields Sf.

The CPB projection apparatus of FIG. 1 comprises an electron gun 1 and a condenser lens 2 that collimates the electron beam. A field-selection deflector 3 situated downstream of the condenser lens 2 appropriately deflects, in the x and y directions (directions orthogonal to each other and to the optical axis AX), the electron beam such that the electron beam is incident on a selected subfield $Sf_k$ on the mask 100 (wherein $1 \leq k \leq n$ and n is the number of mask subfields in the mask 100). Downstream of the mask 100 is a deflector 6 that appropriately deflects, in the x and y directions, the electron beam after the beam has passed through the mask 100. Also downstream of the mask 100 are projection lens systems 8, 9 that appropriately focus the electron beam to produce an image of each mask subfield Sf on the corresponding transfer subfield WSf on the substrate.

The CPB projection apparatus further comprises a mask stage 4 that holds the mask 100 and moves the mask horizontally in the x and y directions as required to sequentially project the mask subfields. An actuator 5 drives the mask stage 4. Interfaces 15, 16 provide electronic interface between the respective deflectors 3, 6 and a controller 14. Power sources 17, 18, 19 supply power to the projection lens systems 8, 9 and to the condenser lens 2, respectively.

A substrate stage 10 holds a sensitive substrate 110 and moves the substrate horizontally in the x and y directions as required to make an exposure at each transfer subfield on the substrate. An actuator 11 moves the substrate 10. The positions of the mask stage 4 and the substrate stage 10 in the x and y directions are detected by respective position detectors 12 and 13 each comprising, e.g., a laser interferometer or analogous device. Data concerning the detected positions of the mask stage 4 and the substrate stage 10 in the x-y plane are generated by the respective position detectors 12, 13 and supplied to the controller 14. A memory 141 stores data concerning the position, in each of the mask subfields Sf, of pattern segments, having minimum-linewidth features, that should be projected with maximal accuracy and resolution. In other words, each mask subfield $Sf_k$ ($1 \leq k \leq n$) typically includes one or more pattern segments having minimum-linewidth features, the image of which features must be projected onto the photosensitive substrate with minimum blur. The positions of these pattern segments are referred to as the "minimum-linewidth segment positions" $p_k$. The memory 141 stores data concerning the minimum-linewidth segment positions $p_1$ through $p_n$ in advance. An arithmetical processor 142 calculates the degree of blur of the pattern segments that could otherwise be caused, e.g., by aberrations of the projection lens systems 8, 9, or any of various other types of aberrations. The controller 14 controls the magnitude of deflection of the electron beam by the deflectors 3 and 6, the movement of the stages 4 and 10, and the amount of power delivered to the projection lens systems 8, 9.

Whenever a pattern of a selected mask subfield $Sf_k$ ($1 \leq k \leq n$) is projected onto a corresponding transfer subfield $WSf_k$ on the sensitive substrate 110, the focal lengths of the projection lens systems 8 and 9 are automatically adjusted so as to minimize the degree of blur of the pattern segments, of the mask subfield, having minimum-linewidth segments, such pattern segments being located at positions $p_k$ for the particular mask subfield $Sf_k$.

FIG. 2 illustrates a flowchart of the operation of the controller 14 by which the focal lengths of the projection lens systems 8 and 9 are set for each mask subfield. When projecting the pattern of a selected mask subfield $Sf_k$ onto the corresponding transfer subfield $WSf_k$ on the sensitive substrate, the deflector 3 deflects the electron beam so that the beam illuminates the selected mask subfield $Sf_k$. During projection of the image of the selected mask subfield, the mask stage 4 and the wafer stage 10 are continuously moving in opposing directions. The deflector 6 deflects the electron beam, that has passed through the mask subfield $Sf_k$, so that the electron beam strikes the corresponding transfer subfield $WSf_k$ on the sensitive substrate 110.

The mask subfield $Sf_k$ that is to be projected at a given instant is selected out of the mask subfields $Sf_1$–$Sf_n$. In step S101, the arithmetical processor 142 calculates the degree of blur at the positions $p_k$ of pattern segments having minimum linewidth features in the selected mask subfield $Sf_k$. The calculations are based on: (1) the minimum-linewidth segment positions $p_k$ stored in the memory 141, and (2) the degrees of deflection of the electron beam that must be produced by the deflectors 3 and 6 in order to make an exposure of the selected mask subfield $Sf_k$.

As the minimum-linewidth segment positions $p_k$ deviate from the center of the respective mask subfield $Sf_k$, aberrations generally increase in proportion to the square of the distance from the center of the mask subfield to each of the minimum-linewidth segment positions $p_k$. Aberrations other than spherical aberration and distortion have little dependence on the focal lengths of the projection lens systems, and are determined mainly by the required degree of deflection of the electron beam. Although the calculated amount of blur mainly depends on the focal lengths of the projection lens systems 8 and 9, a blur due to aberrations caused by deflection and to hybrid terms corresponding to these aberrations is preferably taken into account in calculating the total amount of blur. For example, whenever field curvature is considered, deflected field curvature and hybrid field curvature due to deflection must be taken into account in calculating the degree of blur.

In step S102, the focal lengths of the projection lens systems 8 and 9 are calculated for the selected mask subfield $Sf_k$ so that the degree of blur at the minimum-linewidth segment positions $p_k$, calculated in step S101, is minimized.

In step S103, it is determined whether or not the respective focal lengths have been calculated for all of the mask subfields $Sf_1$ through $Sf_n$. If the focal lengths have been calculated for all the mask subfields $Sf_1$ through $Sf_n$, the process advances to step S104, otherwise the process returns to step S101.

In step S104, the projection lens systems 8 and 9 are energized such that their focal lengths agree with the focal-length values calculated in step S102. Then, the process advances to step S105, in which the image of the selected mask subfield $Sf_k$ is projected onto the corresponding transfer subfield $WSf_k$ on the sensitive substrate 110.

In step S106, it is determined whether or not the images of all the mask subfields $Sf_1$ through $Sf_n$ have been projected onto corresponding transfer subfields $WSf_1$ through $WSf_n$ on the substrate. If all the mask subfields have not been projected, the process returns to step S104 to repeat steps S104 and S105. When all the mask subfields $Sf_1$ through $Sf_n$ have been projected onto corresponding transfer subfields $WSf_1$ through $WSf_n$ on the sensitive substrate 110, the process terminates.

FIG. 3 illustrates a representative distribution of blur in the projected pattern, on the respective transfer subfield $WSf_n$, of the selected mask subfield $Sf_n$ on the substrate 110. The symbol Cd represents a minimum-linewidth feature.

In FIG. 3(a), the minimum-linewidth feature Cd is located in the center of the transfer subfield WSf. For this transfer subfield, the focal lengths of the projection lens systems 8 and 9 are set so that the degree of blur is at a minimum (of degree b0) in the center of the projected image. In this case, the blur distribution in the wafer subfield WSf is the same as that depicted in FIG. 4(a) where the electron beam is focused on the center of the transfer subfield WSf.

In FIG. 3(b), the minimum-linewidth feature Cd is located in the upper right corner of the transfer subfield WSf. In this case, the focal lengths of the projection lenses 8 and 9 are set so that the degree of blur in the pattern image is a minimum (e.g., of degree b2) in the four corners of the transfer subfield WSf.

Although the preferred embodiment has been described above using an example in which each of the mask subfields Sf contains only one pattern segment having minimum-linewidth features, the present invention can accommodate instances in which the mask subfields Sf contain two or more pattern segments having minimum-linewidth features. In such an instance, the focal lengths of the projection lenses 8 and 9 are preferably set so as to minimize average degrees of blur in the various pattern segments having minimum-linewidth features in each transfer subfield WSf. In addition, in this embodiment, steps S101 through S103 shown in FIG. 2 (i.e, the detection of the amount of blur and the calculation of the focal lengths of the projection lens systems 8 and 9 for each of the mask subfields $Sf_1$ through $Sf_n$) are performed by the arithmetical processor 142.

As an alternative, the optimal focal length required to project each of the mask subfields $Sf_1$ through $Sf_n$ with minimal blur may be pre-calculated by a separate computer or the like, and the resulting focal-length data can be stored in a memory 141 in advance. In such a case, the projection lens systems 8 and 9 can be energized based on the focal-length data stored in the memory 141.

Furthermore, in step S102 of FIG. 2, blur caused by an aberration arising from the deflection of the electron beam and its hybrid term is preferably taken into consideration in calculating the total amount of blur. However, if the amount of the blur due to aberrations arising from deflection of the electron beam is relatively smaller than the amount of the blur due to lens aberrations in the projection lens systems 8 and 9, then the focal lengths of the projection lens systems 8 and 9 can be adjusted without considering the deflection aberration. I.e., the focal lengths may be set so as to minimize only the blur due to the aberrations of the projection lens systems 8 and 9.

The pattern segments having minimum-linewidth features of each mask subfield need not contain features that are at the absolute minimum achievable linewidth (i.e., at the critical dimension level) for the particular mask; the pattern segments having minimum-linewidth features of a particular mask subfield may simply be regions of the subfield having the smallest features within that mask subfield.

It will be understood that any of the projection lens systems 8 and 9, the controller 14, and the memory 141 can comprise a suitable equivalent means in place of the preferred means discussed above.

The focal length of the CPB-optical system is set for each of the mask subfields so that the degree of blur is minimized in pattern segments having minimum-linewidth features of the corresponding wafer subfields. This allows the entire mask pattern to be projected onto the sensitive substrate at a resolution sufficiently high for each such portion of the mask pattern.

While the invention has been described by way of an exemplary embodiment, it is understood that many changes and substitutions may be made by those skilled in the art without departing from the spirit and the scope of the invention, which is not limited to the above embodiments, but is defined instead by the literal and equivalence scope of the appended claims.

What is claimed is:

1. A charged-particle-beam (CPB) projection method, comprising the steps of:
    (a) emitting a charged-particle beam onto a mask defining a pattern to be projected onto a sensitive substrate, the pattern being divided into multiple mask subfields, each mask subfield containing one or more pattern segments having minimum-linewidth features;
    (b) projecting each of the mask subfields onto respective transfer subfields on the substrate using a CPB-optical system and deflectors; and
    (c) before exposing each mask subfield, setting the focal length of the CPB-optical system based on the location within the mask-subfield of the pattern segments having minimum-linewidth features, so as to minimize blur of the projected mask subfield image on the respective transfer subfield at the pattern segments having minimum-linewidth features.

2. The method of claim 1, wherein the charged-particle beam is an electron beam.

3. The method of claim 1, wherein the step of setting the focal length of the CPB-optical system for exposing each of the mask subfields comprises setting the focal length based on an amount of deflection produced by the deflectors in order to project an image of the respective mask subfield onto the corresponding transfer subfield.

4. The method of claim 1, wherein the step of setting the focal length of the CPB-optical system for each of the mask subfields comprises calculating an image blur at the one or more pattern segments having minimum-linewidth features of the mask subfield and determining a focal length that minimizes the calculated image blur.

5. The method of claim 1, wherein the step of setting the focal length of the CPB-optical system for each of the mask subfields comprises retrieving from a memory a pre-calculated focal length for exposing each of the mask subfields, the pre-calculated focal length being used to expose the respective mask subfield with minimal image blur at the pattern segments having minimum-linewidth features of the respective mask subfield.

6. A charged-particle-beam (CPB) projection method, comprising the steps of:
    (a) emitting a charged-particle beam onto a mask defining a pattern divided into multiple mask subfields, each mask subfield including a pattern segment having minimum-linewidth features;
    (b) deflecting the charged-particle beam so as to selectively guide the charged-particle beam individually to the mask subfields for exposure;
    (c) for each mask subfield, projecting the mask subfield pattern onto a respective transfer subfield on a sensitive substrate using a CPB-optical system and deflectors; and
    (d) before exposing each mask subfield, setting the focal length of the CPB-optical system based on the position of the pattern segment having minimum linewidth features in the respective mask subfield and on the amount of deflection of the charged-particle beam necessary to expose the respective mask subfield, such that a degree of blur in the image of the respective mask subfield projected onto the respective transfer subfield on the sensitive substrate is minimized at the pattern segment having minimum linewidth features.

7. A charged-particle-beam (CPB) projection apparatus, comprising:
    (a) a beam emitter for emitting a charged-particle beam onto a mask defining a pattern divided into multiple mask subfields, each mask subfield including a pattern segment having minimum-linewidth features;
    (b) deflectors for deflecting the charged-particle beam to selectively and sequentially guide the charged-particle beam individually to the mask subfields for exposure;
    (c) a CPB-optical system for projecting the image of each mask subfield onto a corresponding transfer subfield on a sensitive substrate;
    (d) a memory for storing data concerning the position of the pattern segment having minimum-linewidth features of each of the mask subfields;
    (e) an arithmetical processor for retrieving, for each of the mask subfields, the data concerning the position of the pattern segment having minimum linewidth features of the respective mask subfield and for calculating a focal length of the CPB-optical system for exposing the respective mask subfield so that the degree of blur of the image of the respective mask subfield in the respective transfer subfield is minimized at the pattern segment having minimum linewidth features of the respective transfer subfield; and
    (f) a controller for controlling the CPB-optical system so that the actual focal length of the CPB-optical system agrees with the value calculated by the arithmetical processor before the respective mask subfield is exposed.

8. The apparatus of claim 7, wherein the arithmetical processor comprises a calculator for calculating respective optimal focal lengths of the CPB-optical system for the respective mask subfields based on previously stored data concerning the position of the pattern segment having minimum-linewidth features in the respective mask subfields, before exposing the respective mask subfields, so that the degree of blur due to aberrations of the CPB-optical system is minimized during actual exposure of the respective mask subfields.

9. The apparatus of claim 7, wherein the arithmetical processor comprises a calculator for calculating the respective optimal focal lengths of the CPB-optical system for the respective mask subfields based on data, previously stored in a memory, concerning the position of the pattern segment having minimum-linewidth features in the respective mask subfields, before exposing the respective mask subfields, so that the degree of blur due to aberrations of the CPB-optical system and to aberrations caused by deflection of the charged-particle beam by the deflectors, is minimized during actual exposure of the respective mask subfields.

10. A charged-particle-beam (CPB) projection apparatus, comprising:
    (a) a beam emitter for emitting a charged-particle beam onto a mask defining a pattern divided into multiple mask subfields each containing a pattern segment having minimum-linewidth features;
    (b) multiple deflectors for deflecting the charged-particle beam to guide the charged-particle beam to each selected mask subfield, and from the selected mask subfield to a respective transfer subfield on a sensitive substrate;

(c) a CPB-optical system for projecting an image of the selected mask subfield onto the respective transfer subfield on the sensitive substrate;

(d) a memory for storing data concerning an optimal focal length of the CPB-optical system, for each of the respective mask subfields, based on the position of the pattern segment having minimum-linewidth features in each of the respective mask subfields, the focal length being determined to produce a degree of blur of the image of the selected mask subfield on the respective transfer subfield that is minimized at the pattern segment having minimum-linewidth features; and (e) a controller for controlling the CPB-optical system so that the focal length of the CPB-optical system agrees with the focal length corresponding to the data stored in the memory before the selected mask subfield is exposed.

* * * * *